(12) United States Patent
Heerens et al.

(10) Patent No.: US 6,856,376 B2
(45) Date of Patent: Feb. 15, 2005

(54) LITHOGRAPHIC APPARATUS, APPARATUS CLEANING METHOD, DEVICE MANUFACTURING METHOD AND DEVICE MANUFACTURED THEREBY

(75) Inventors: Gert-Jan Heerens, Schoonhoven (NL); Sjoerd Nicolaas Lambertus Donders, 's-Hertogenbosch (NL); Franciscus Andreas Cornelis Johannes Spanjers, Oirschot (NL); Aschwin Lodewijk Hendricus Johannes Van Meer, Roosendaal (NL); Thomas Josephus Maria Castenmiller, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/342,322

(22) Filed: Jan. 15, 2003

(65) Prior Publication Data

US 2003/0184720 A1 Oct. 2, 2003

(30) Foreign Application Priority Data

Jan. 18, 2002 (EP) .............................. 02250345

(51) Int. Cl.[7] ............................................. G03B 27/52
(52) U.S. Cl. ........................................................ 355/30
(58) Field of Search ............................. 355/30; 15/1.51

(56) References Cited

U.S. PATENT DOCUMENTS

| | | | | |
|---|---|---|---|---|
| 4,744,833 A | * | 5/1988 | Cooper et al. ................. 134/1 |
| 5,634,230 A | * | 6/1997 | Maurer ....................... 15/1.51 |
| 5,673,208 A | | 9/1997 | Meier et al. |
| 6,055,742 A | | 5/2000 | Kim |
| 6,159,333 A | * | 12/2000 | Gupta et al. ............. 156/345.1 |
| 6,249,932 B1 | * | 6/2001 | Chu et al. ..................... 15/345 |
| 6,395,102 B1 | * | 5/2002 | Salamati-Saradh et al. ... 134/37 |
| 6,431,185 B1 | * | 8/2002 | Tomita et al. ............... 134/1.3 |
| 6,453,496 B1 | * | 9/2002 | Lee ................................ 15/1 |
| 6,500,268 B1 | * | 12/2002 | Henley ......................... 134/1 |
| 6,511,575 B1 | * | 1/2003 | Shindo et al. .......... 204/298.34 |
| 6,526,997 B1 | * | 3/2003 | Henley ....................... 134/1.3 |
| 6,589,354 B2 | * | 7/2003 | Reid .............................. 134/1 |
| 6,676,800 B1 | * | 1/2004 | Festa et al. ................. 134/1.1 |
| 2002/0029788 A1 | * | 3/2002 | Verhaverbeke et al. ...... 134/1.3 |
| 2002/0150839 A1 | * | 10/2002 | Peng .......................... 430/313 |
| 2002/0170665 A1 | * | 11/2002 | Kamatani et al. ......... 156/272.6 |

FOREIGN PATENT DOCUMENTS

WO    WO 02/053300 A1    7/2002

* cited by examiner

Primary Examiner—Rodney Fuller
(74) Attorney, Agent, or Firm—Pillsbury Winthrop LLP

(57) ABSTRACT

In a low-pressure environment, a voltage is applied between a tool tip in close proximity to a surface and that surface. Contaminants on the surface are attracted and adhere to the tool. A laser may also be used for in situ cleaning of components of a lithographic projection apparatus.

23 Claims, 3 Drawing Sheets

A

B

C

D

E

F

LITHOGRAPHIC APPARATUS, APPARATUS CLEANING METHOD, DEVICE MANUFACTURING METHOD AND DEVICE MANUFACTURED THEREBY

RELATED APPLICATION

This application claims the benefit of priority to European Patent Application No. 02250345.2, filed Jan. 18, 2002, the contents of which are herein incorporated by reference.

BACKGROUND OF THE INVENTION

1. Field of the Invention

The present invention relates to a lithographic apparatus, an apparatus cleaning method, a device manufacturing method and a device manufactured thereby.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a predetermined position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection stystem may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the addition tables may be used in parallel or preparatory steps may be carried our on one or more tables while one or more other tables are being used for exposures. Dual stage lithographic apparatus are described, for example, in U.S. Pat. Nos. 5,969,441 and 6,262,796.

Although lithographic apparatus are operated in clean rooms and flushed with clean air, contamination of the apparatus does occur and, depending on the location and type of contaminant, causes various problems. For example, inorganic contaminants on the mask deriving from the air in the clean room or from manufacture, transportation and storage of the mask can cause localized absorption of the projection beam leading to dose errors and improper imaging of mask features or even printing of marks in what should be blank areas. Particulates on the substrate table can distort the substrate leading to localized focus errors known as hot spots. In addition to the ambient air and the manufacture, etc. of masks and substrates, sources of contamination include resist debris sputtered from the substrate by the projection beam during exposures and mechanical contact between moving parts of the apparatus, which may cause particulates to be dislodged from the contacting surfaces.

To minimize errors caused by contamination, susceptible parts of the apparatus, such as masks, mask tables and substrate tables, are cleaned periodically. This generally is a time-consuming manual task, taking two hours or more to clean a substrate table for example, which causes undesirable downtime of the apparatus and most be carried out by skilled engineers. On occasion, manual cleaning fails to remove the contaminants and must be repeated. Selective cleaning of a burl table is disclosed in U.S. Pat. No. 6,392,738 using an abrasive tool or electromagnetic radiation of unspecified form. U.S. Pat. No. 6,249,932 discloses a manual cleaning head using blown air and vacuum for cleaning a table in a lithographic projection apparatus. Various methods of cleaning substrates are known, see for example U.S. Patent Application publication 2002/0096195 and WO 02/42013, but these require the substrates to be placed in special machines.

SUMMARY OF THE INVENTION

It is an aspect of the present invention to provide a method and device for in situ cleaning of components of a lithographic apparatus.

This and other aspects are achieved according to the present invention in a lithographic apparatus including a radiation system constructed and arranged to supply a projection beam of radiation; a support structure constructed and arranged to support a patterning device, the patterning device constructed and arranged to pattern the projection beam according to a desired pattern; a substrate table constructed and arranged to hold a substrate; a projection system constructed and arranged to project the patterned beam onto a target portion of the substrate; and a cleaning device for cleaning a component of in the lithographic apparatus in situ, the cleaning device comprising: a contaminant liberating device constructed and arranged to use electromagnetic fields to liberate contaminants from the surface of the component to be cleaned; and a contaminant removal device constructed and arranged to remove liberated contaminants from the apparatus.

The contaminant liberating device may comprise a laser device constructed and arranged to direct a cleaning beam of radiation against the surface of the component to be cleaned to ablate and/or thermally dislodge contaminants thereon. It has been found that a laser beam is effective at dislodging contaminants, for example by ablation, evaporation or by causing thermal shock waves, without damaging the underlying surface.

The laser device may comprise a beam scanning device constructed and arranged to vary the angle of the cleaning beam to scan the surface to be cleaned. In this way, the laser beam can be directed at a predetermined angle of incidence to a spot on the component that needs cleaning.

The laser device may be adapted to emit a pulsed beam as the cleaning beam, the pulsed beam preferably including pulses having a duration of less than 100 nanoseconds. A pulsed beam is effective at producing thermal shockwave effects and can provide a high power beam.

In another exemplary embodiment, the laser device is adapted to vary the wavelength of the cleaning beam. This enables the wavelength of the cleaning beam to be selected to be a wavelength particularly effective for a given contaminant.

Another exemplary embodiment includes a laser device that is adapted to emit a beam of plane polarized light as the cleaning beam and preferably to direct the plane polarized light at the surface at less than or equal to Brewster's angle. In this way, delicate thin films can be protected since most of the laser light will be absorbed by the contaminant rather than the surface being cleaned.

In another exemplary embodiment, the contaminant liberating device includes a device constructed and arranged to provide a non-ionizing environment around the component to be cleaned; a cleaning tool positionable in close proximity to the component to be cleaned; and a voltage source constructed and arranged to apply a potential difference between the component to be cleaned and the cleaning tool.

By providing a non-ionizing, e.g. low-pressure, environment around the component to be cleaned, electrostatic forces due to the potential difference between the cleaning tool and the component to be cleaned can be used to attract and retain contaminants to the cleaning tool without causing electrical discharges (sparking) that might damage the component being cleaned. The low-pressure environment (i.e. lower than standard atmospheric pressure) may be achieved by partially evacuating the relevant volume. Alternatively, the environment around the component to be cleaned may be flushed with a non-ionizing gas (e.g. an inert gas such as argon) or gas mixture. The environment should be such that electrical discharges do not occur at the field gradients existing when the device is used. The cleaning efficiency of the invention increases with lower pressure and the invention is therefore advantageous in a lithographic apparatus using EUV radiation as the exposure radiation since a relatively hard vacuum environment can be provided.

The cleaning device of the present invention functions in situ, avoiding the need to open up and dismantle the apparatus to remove the component to be cleaned. This substantially reduces the downtime for cleaning and may allow more frequent cleaning, e.g. between batches of wafers. Preferably, the cleaning tool is mounted on a positioning device which enables the cleaning tool to be scanned over the surface of the component to be cleaned, e.g. under automatic control. Such a positioning device may be, for example, a robot arm. Where the component to be cleaned is a mask or a substrate table, the scanning can be effected by the positioning device provided to position the table during an exposure. In this way, cleaning can be automated, avoiding the need for skilled engineers to perform the cleaning and increasing the reliability of the cleaning process.

The potential difference and separation between the tool and the component to be cleaned necessary to remove contaminants will depend on the contaminants to be removed and the properties of the surface to which they are adhered. The potential difference and separation will therefore be determined by the one of ordinary skill in the art for particular embodiments of the invention. However, the separation between tool and component is preferably in the range of 10 nm to 30 mm and the potential difference in the range of 0.1 to 100 Kv. The potential difference may also be time varying and may alternate in polarity.

The shape of the tip of the tool, the part of the tool closest to the component to be cleaned, will also determine the effectiveness of contaminant removed since the shape of the tool tip affects the electric field gradients and hence the electrostatic forces exerted on the contaminants. Tool tips useable in the invention may take the form of a plate, a corrugated plate, a wire, a gauze, a sharp edge or a point. In an exemplary embodiment of the present invention, the cleaning tool is provided with a plurality of tips of identical or different form or dimensions selected for their differing cleaning effects.

The cleaning device of the present invention may also be provided with an ionizing device constructed and arranged to ionize the contaminants and hence increase their attraction to the cleaning tool. The ionizing device may take the form of an ultraviolet lamp or an electron gun, for example.

Also, the cleaning device may be provided with a laser arranged to irradiate the surface of the component to be cleaned to ablate contaminants thereon. Such a laser can also cause rapid heating of contaminant particles leading to rapid expansion thereof which may release them from the surface to which they were adhered.

Furthermore, the cleaning device may be provided with a cooling device constructed and arranged to cool the cleaning tool, or at least its tip. This improves adhesion of contaminants to the tool and reduces return of contaminants to the cleaned component.

Of course, multiple cleaning devices may be provided in an apparatus to clean one or more components of the apparatus.

The component to be cleaned may be any component that is subjected to contaminants but the invention is advantageous when applied to mask and substrate clamping devices which are most susceptible to contamination due to the relatively frequent changing of masks and substrates.

According to a further aspect of the present invention there is provided a method of cleaning a lithographic apparatus including using a cleaning device integrated into lithographic apparatus to clean a component thereof, the cleaning device liberating particles from the surface of a component to be cleaned using electromagnetic fields.

Another aspect of the invention provides a device manufacturing method including providing a substrate that is at least partially covered by a layer of radiation-sensitive material; projecting a patterned beam of radiation onto a target portion of the layer of radiation-sensitive material; using a cleaning device integrated into lithographic apparatus to clean a component thereof, the cleaning device liberating particles from the surface of the component to be cleaned using electromagnetic fields.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
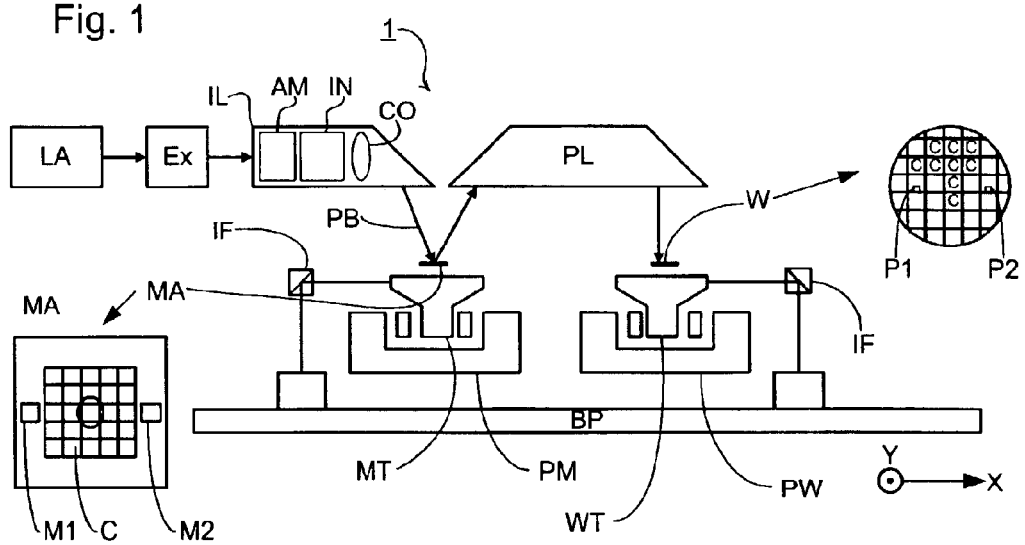
FIG. 1 depicts a lithographic projection apparatus according to an embodiment of the invention.

FIG. 1 schematically depicts a lithographic projection apparatus 1 according to an embodiment of the invention. The apparatus 1 includes a base plate BP; a radiation system Ex, IL constructed and arranged to supply a projection beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces a beam of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and α-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:
1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
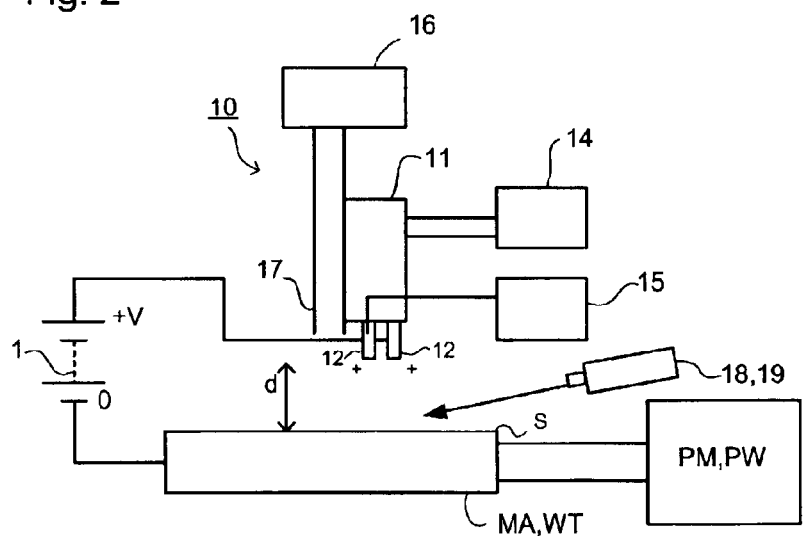
FIG. 2 depicts a cleaning device forming part of the lithographic apparatus according to the first embodiment of the present invention.

FIG. 2 shows a cleaning device 10 that may be used to clean the surfaces of the mask MA or the wafer table WT. The cleaning device 10 includes a cleaning tool 11 bearing tool tips 12. Although in this embodiment two tool tips 12 are shown, a single tool tip or more than two tool tips may be used. Where there are multiple tool tips 12, they may be the same, or different sizes and/or shapes. Possible shapes of tool tips usable in the invention are described below.

The cleaning tool 11 is positioned at a predetermined distance d above the surface S to be cleaned by a tool positioning system 14 and a potential difference V is applied between the component MA, WT to be cleaned and the tool tip(s) 12. The distance d, tool tip number and shape(s), potential difference V and the pressure around the cleaning tool 11 are selected according to the contaminants to be removed and the surface properties of the component MA, WT. A large electric field gradient (high density of field lines) is desirable to remove contaminants from the surface S, but if the ambient gas ionizes in the electric field this can cause discharges between tool tip(s) 12 and the surface S which are damaging. To minimize such discharges, a low-pressure environment is maintained at least in the vicinity of the tool tip by a vacuum pump 16 that draws gas and contaminants out through an exhaust nozzle 17 provided on the cleaning tool 11. In an EUV lithography apparatus the vacuum pump 16 may form part of the vacuum system that keeps the projection beam path under a deep vacuum during exposures. In place of or in addition to vacuum pump 16, a gas supply 15 constructed and arranged to supply a non-ionizing gas, e.g. an inert gas such as argon, may also be used to provide a non-ionizing environment.

To clean the whole surface S, the cleaning tool 11 and component MA, WT are scanned relatively. This can be achieved by the tool positioning system 14 scanning the tool 11 over the stationary component MA, WT or by the positioning devices PM, PW provided to position the component MA, WT prior to and during exposures, scanning the component under the stationary tool 11 or by a combination of both. For example, if the component to be cleaned is a mask MA and the first positioning device PM is only capable of a scan in one direction, the scan in the orthogonal direction may be performed by the tool positioning system 14. Alternatively, the tool tip 12 or an array of tool tips 12 may extend across the operative width of the surface S perpendicular to the scanning direction of the first positioning device PM so that the entire surface S is cleaned with a scan in a single direction.

As discussed above, contaminants on the surface S are lifted off surface S and attracted to the tool tips 12 by virtue of the electric field caused by the potential difference V between surface S and tool tip 12. To enhance removal of contaminants from surface S, an ionizing device 18 may be provided. This may take the form of an UV lamp or an electron gun which directs UV radiation or an electron beam onto the surface S in the vicinity of the cleaning tool 11. If desired, both an UV lamp and an electron gun may be used. It will be appreciated that negatively charged contaminants are more rapidly attracted to the positively charged tool tip 12. Alternatively, or in addition, a visible light laser 19 may be used. The radiation from the laser 19 acts to evaporate or ablate organic contaminants on surface S, which are then attracted to the charged tool tip 12. The laser 19 also assists in dislodging particulate contaminants. The rapid thermal expansion of the particulate caused by heating by the laser beam can break any bond that may have formed between the particulate and surface S. Also, explosive evaporation or ablation of other contaminants in the vicinity of a particulate may dislodge it.

Figure 3:
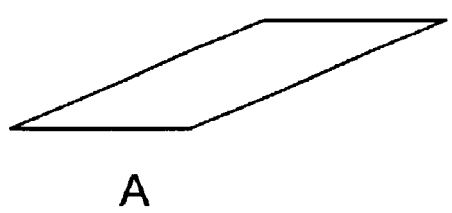
FIGS. 3A to F depict different forms of cleaning tool tip that may be used in the cleaning device of FIG. 2.
Figure 3:
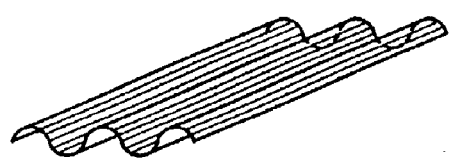
Figure 3:
Figure 3:
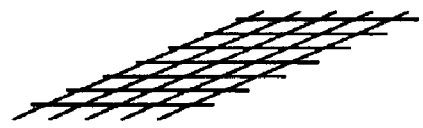
Figure 3:
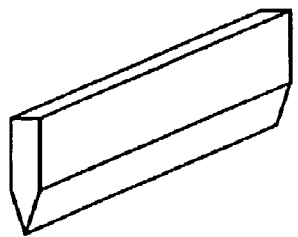
Figure 3:

FIGS. 3A to F depict various different shapes of tool tip that may be used in the present invention. The basic plate, FIG. 3A, provides a generally uniform field and can be used for a gentle initial cleaning or where discharges are particularly to be avoided. A corrugated plate, FIG. 3B, provides a stronger field in the vicinity of the ridges for a stronger cleaning effect. A thread, FIG. 3C, provides a concentrated field along a single line while a gauze, FIG. 3D, provides multiple regions of concentrated field. The strongest fields are generated by sharp edges, FIG. 3E, and point tips, FIG. 3F, which may also be conical. As mentioned above, multiple tool tips 12 of the same or differing types may be provided on a cleaning tool 11. Where the tool and surface are relatively scanned, multiple tips can be arranged perpendicular to the scanning direction to clean a wider strip with each scan and hence reduce cleaning times. Multiple tips may also be arranged parallel to the scanning direction to avoid the need for multiple cleaning passes. Different tool types may be used so that there is an increasing field strength providing an increasing cleaning effect without the risk of an electric discharge through volatile contaminants liberated from the surface S.

It will be appreciated that multiple cleaning devices may be provided in a lithographic apparatus to clean different surfaces or different components on the same surface to reduce cleaning times. In one embodiment, two cleaning devices are joined together to clean opposite sides of the mask MA at the same time. Of course, it is possible to only clean operative areas of the surfaces of components.

As mentioned above, the predetermined distance d separating the tool tips 12 and surface S and the applied potential difference V will vary from embodiment to embodiment. However, the inventors have determined that effective cleaning can be performed using a distance d in the range of 10 nm to 30 mm and a voltage V in the range of 0.1 to 100 kV. The applied potential difference may be time varying and may alternate in polarity.

Figure 4:
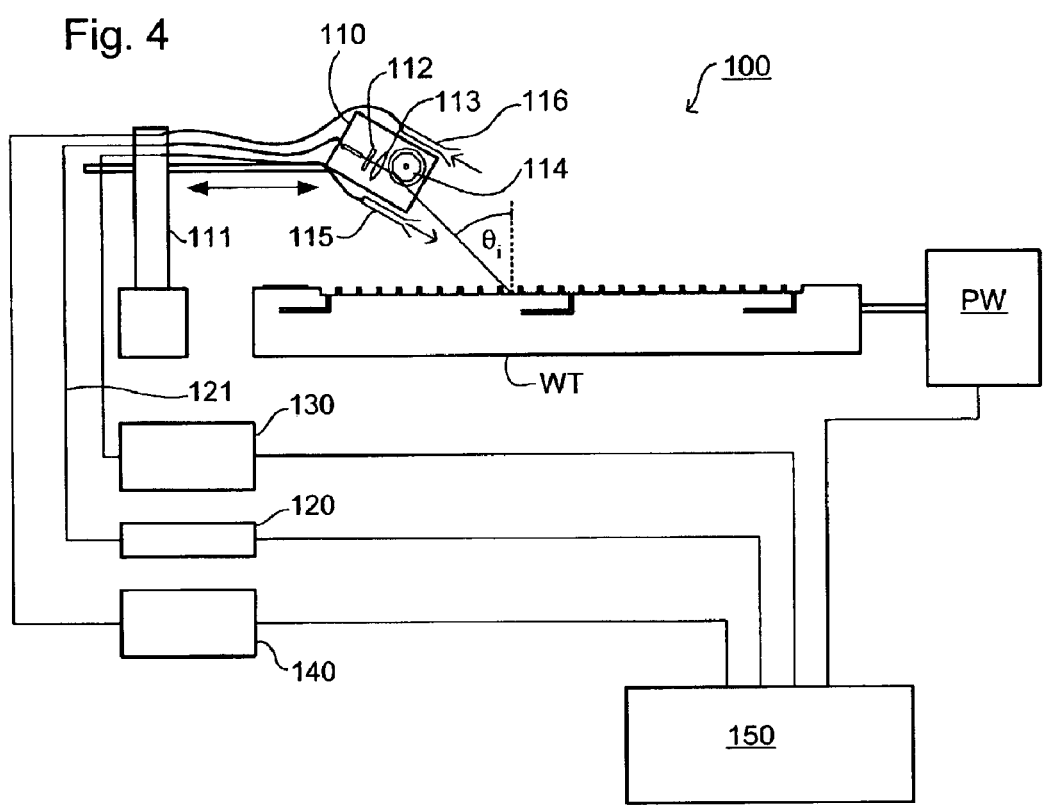
FIG. 4 depicts a cleaning device forming part of a lithographic projection apparatus according to a second embodiment of the invention.

A second embodiment of the invention is shown in FIG. 4. The cleaning device 100 includes a laser cleaning head 110 which is mounted on a support 111 so as to be retractable form an operative position, at which a laser cleaning beam can be directed onto the surface of the object to be cleaned, in this case substrate table WT, to a non-operative position at which it is out of the way of the projection beam and does not obstruct any other parts of the apparatus used during an exposure.

A laser source 120 provides a laser beam via an optical fiber 121 to the laser cleaning head 110 which includes a polarizer 112, a collimating lens 113 and a moveable mirror 114. A laser cleaning beam can thus be directed onto the substrate table WT at a predetermined angle of incidence $\theta_i$. The moveable mirror 114 may comprise a polygon mirror attached to a motor, as shown, which can effect a rapid scan of the beam along a line, or a simple plane mirror attached to an actuator to control its orientation if a slower change of angle suffices.

The laser cleaning beam is directed against the surface to be cleaned and liberates contaminants therefrom by a combination of ablation, combustion and thermal effects. Organic contaminants are mainly vaporized and combusted if any oxygen is present. The vaporized contaminants may assist in removing heavier contaminants that are not vaporized and may also be turned into a plasma by continued absorption of energy from the laser cleaning beam. Inorganic contaminants, mainly particles, absorb energy from the laser beam rapidly and the resulting thermal expansion causes a shockwave which dislodges the contaminant form the surface. The particles may also be subject to ablation and/or sublimation.

To optimize the cleaning process, the wavelength of the laser cleaning beam is chosen for maximum absorption by the expected contaminants. Several sources or a source of variable wavelength may be used to provide optimum cleaning of different contaminants. A wavelength or wavelengths in the range of from 157 to 1064 nanometers has been found to be suitable. The laser source 120 may be a YAG, $CO_2$ or excimer laser.

The inventors have found that a pulsed cleaning beam is particularly effective, especially with a short pulse length, e.g. less than 100 nanoseconds and preferably less that 10 nanoseconds. With a pulsed source, the thermal shockwave effect is pronounced. Also, subsequent pulses impinging on vaporized or dislodged contaminants may generate a plasma and further shock waves, which assist in dislodging contaminants. A Q-switched laser can be used to provide high power short laser pulses.

For protection of delicate films on the component to be cleaned, a polarized beam with the plane of polarization lying in the plane of incidence is used. The beam is then directed onto the surface to be cleaned at an angle of incidence $\theta_i$ less than Brewster's angle for the surface and/or films in question. In this way absorption of the cleaning beam in the surface to be cleaned is minimized and hence also degradation of the surface and any films thereon.

Also included in the laser cleaning head 110 are a flushing gas outlet 115, connected to flushing gas supply 130, and an evacuation inlet 116, connected to a vacuum pump 140. By means of these, an inert flushing gas, e.g. Argon can be provided to the vicinity of the surface being cleaned. The flushing gas has several functions: it protects the surface being cleaned form oxidation during and after ablation; it prevents contaminants liberated from the surface from dispersing into the remainder of the apparatus by locally reducing the mean-free path; and it prevents vaporized hydrocarbons from contaminating the vacuum chamber walls. Contaminants liberated from the surface being cleaned are entrained in the flushing gas which is removed via the evacuation inlet 116.

The laser cleaning beam can be directed to the predetermined location to be cleaned by a combination of control over the position of the laser head 110, the angle of the emitted beam and the position of the component to be cleaned. In an exemplary embodiment of the invention, the laser head 110 is simply displaceable between operative and non-operative positions, which enables a simple positioning device to be implemented. The moveable mirror is primarily used to control the angle of incidence of the cleaning beam while the object to be cleaned is moved to determine which part of the surface is to be cleaned. Such an arrangement is particularly useful for cleaning substrate tables which are provided with a a positioning device PW with a wide range of movement in X and Y directions. For the mask table, which may have a wide range of movement only in the Y direction, a cleaning head moveable in X may be used.

The cleaning device may be used to perform a complete sweep of areas of the component susceptible to contamination and where contamination is critical or may be coupled to a contamination detector and used to clean only those places where contamination is detected. In the latter case, the laser trigger should be coupled to the table positioning device, via control system 150, so as to enable laser cleaning of only the required spots.

In an embodiment, the contamination detector may be a level sensor (not shown in FIG. 1), which is used to detect a surface figure of a surface of the component. The surface figure can be analyzed to determine the presence and/or location of contamination on the component or on another component that influences the component. For example, a deformation of the surface figure of substrate may indicate the presence and/or location of contamination on a substrate table supporting the substrate or on the substrate itself. Such a deformation can be determined by comparing, using software, the surface figure of the component against a known clean surface figure of the component or against a surface of another similar component (e.g., comparison between surface figures of two substrates or patterning devices). The size and nature of the contamination could also be determined from the analysis of the surface figure. A more detailed description of a contamination detector can be found in U.S. Pat. No. 6,392,738, incorporated herein by reference.

Contamination on a surface of a component may be detected and/or cleaned during the production cycle of the lithographic projection apparatus. For example, a substrate table may be cleaned in between unloading of a substrate from and loading of another substrate onto the substrate table when contamination present on a support surface of the substrate table is detected. Similarly, the cleaning and/or detecting of contamination may be effected during preparation of a component. For example, the cleaning and/or detecting may be performed during an alignment process such as at an exposure position or at an alignment position, such as in a pre-aligner or a separate alignment station.

In an exemplary embodiment, just before exposure of a substrate using the lithographic projection apparatus, contamination may be detected by measuring a substrate supported on a substrate table of the lithographic projection apparatus using, for example, the level sensor to prepare a surface figure of the substrate surface. If contamination is detected, the substrate may be removed from the substrate table and the substrate table is cleaned, preferably using a local cleaning technique as described above to clean at the specific locations on a surface of the substrate table where contamination is detected to be located. Once the cleaning is finished, the substrate may be replaced on the substrate table and measured a second time. If contamination is detected again or some other defect is detected, the substrate may be rejected. The substrate could then be removed from the apparatus or cleaned separately. The above process, which can be managed by software in the lithographic projection apparatus, could repeat for another new substrate. The process may also be applied to other components of the lithographic projection apparatus such as the patterning device.

In an embodiment, the lithographic projection apparatus may be a multiple stage device with two or more tables. In this case, the detection and/or cleaning of contamination may be performed with respect to a table in a preparatory and/or loading stage while the other table is used for exposure. Higher throughput can be achieved by performing the detection and/or cleaning steps separate from, and perhaps during, the exposing (and the preparation at the exposure position).

The cleaning operation may be automated and can be performed without opening the lithographic projection apparatus, which will considerably lower the down time and considerably increase the throughput of the apparatus. The cleaning may be done mechanically (e.g., cleaning stone, brushes), chemically (e.g., acetone), by electromagnetic radiation (e.g., laser), etc. For cleaning, and specifically local cleaning, the cleaning can be done at the specific locations where contamination is detected. The local cleaning can be applied, for example, by effecting the relative movement of the application of the point of cleaning and the component (for example, movement of the cleaning device itself or of a beam of electromagnetic beam by a beam directing device).

The cleaning and detection devices described above may be incorporated in a substrate and/or patterning device handling unit positioned next to the imaging part of the lithographic projection apparatus. The handling unit can inspect the substrates and/or patterning devices for contamination, put rejected substrates and/or patterning devices in a special carrier, and hand clean substrates and/or patterning devices over to and take used substrates and/or patterning devices from the imaging part of the lithographic projection apparatus.

While specific embodiments of the invention have been described above, it will be appreciated that the invention may be practiced otherwise than as described. The description is not intended to limit the invention.

What is claimed is:

1. A lithographic projection apparatus, comprising:
   a radiation system constructed and arranged to provide a projection beam of radiation;
   a support structure constructed and arranged to support a patterning device, the patterning device constructed and arranged to pattern the beam according to a desired pattern;
   a substrate table for holding a substrate; and
   a projection system constructed and arranged to project the patterned beam onto a target portion of the substrate; and
   a cleaning device constructed and arranged to clean a component of the lithographic apparatus in situ, the cleaning device comprising:
   a contaminant liberating device constructed and arranged to use electromagnetic fields to liberate contaminants from a surface of the component to be cleaned; and
   a contaminant removal device constructed and arranged to remove liberated contaminants from the apparatus.

2. Apparatus according to claim 1, wherein the contaminant liberating device comprises a laser device constructed and arranged to direct a cleaning beam of radiation against the surface of the component to be cleaned to at least one of ablate and thermally dislodge contaminants thereon.

3. Apparatus according to claim 2, wherein the laser device comprises a beam scanning device constructed and arranged to vary the angle of the cleaning beam to scan the surface to be cleaned.

4. Apparatus according to claim 2, wherein the laser device is adapted to emit a pulsed beam as the cleaning beam, the pulsed beam comprising pulses having a duration of less than 100 nanoseconds.

5. Apparatus according to claim 2, wherein the laser device is adapted to vary the wavelength of the cleaning beam.

6. Apparatus according to claim 2, wherein the laser device is adapted to emit a beam of plane polarized light as the cleaning beam and to direct the plane polarized light at the surface at less than or equal to Brewster's angle.

7. Apparatus according to claim 1, wherein the contaminant removal device comprises a vacuum pump constructed and arranged to evacuate liberated contaminants.

8. Apparatus according to claim 7, further comprising a flushing gas supply constructed and arranged to supply an inert flushing gas to the vicinity of the surface to be cleaned.

9. Apparatus according to claim 1, wherein the contaminant liberating device comprises:
   a device constructed and arranged to provide a non-ionizing environment around the component to be cleaned;
   a cleaning tool positionable in close proximity to the component to be cleaned; and
   a voltage source constructed and arranged to apply a potential difference between the component to be cleaned and the cleaning tool.

10. Apparatus according to claim 9, wherein the device constructed and arranged to provide a non-ionizing environment comprises a device constructed and arranged to evacuate a space containing the component.

11. Apparatus according to claim 9, wherein the device constructed and arranged to provide a non-ionizing environment comprises gas supply constructed and arranged to supply an inert gas to the vicinity of the component to be cleaned.

12. Apparatus according to claim 9, wherein the cleaning tool is positionable at a distance from the surface of the component to be cleaned in the range of from 10 nm to 30 mm.

13. Apparatus according to claim 9, wherein the potential difference is in the range of from 0.1 to 100 kV.

14. Apparatus according to claim 9, wherein the cleaning tool has a tool tip having a shape of a flat plate, a corrugated plate, a wire, a gauze, a sharp edge or point.

15. Apparatus according to claim 14, wherein the cleaning tool has a plurality of tool tips at least two of which have at least one of a different shape and a different size.

16. Apparatus according to claim 9, wherein the cleaning device further comprises an ionizing device constructed and arranged to ionize contaminants on the component to be cleaned.

17. Apparatus according to claim 9, further comprising a positioning device constructed and arranged to provide a relative scanning motion between the cleaning tool and the component to be cleaned.

18. Apparatus according to claim 17 wherein the positioning device comprises a first positioning device constructed and arranged to displace the cleaning device between an operative position and a non-operative position and a second positioning device constructed and arranged to scan the component to be cleaned.

19. Apparatus according to claim 9, wherein the cleaning device further comprises a cooling device constructed and arranged to cool at least part of the cleaning tool.

20. A method of cleaning a lithographic apparatus, comprising:
   using a cleaning device integrated into the lithographic apparatus to clean a component thereof, the cleaning device constructed and arranged to use electromagnetic fields to liberate particles from a surface of the component to be cleaned.

21. A device manufacturing method, comprising:
   providing a substrate that is at least partially covered by a layer of radiation-sensitive material;
   projecting a patterned beam of radiation onto a target portion of the layer of radiation-sensitive material;
   using a cleaning device integrated into a lithographic apparatus to clean a component thereof, the cleaning device constructed and arranged to use electromagnetic fields to liberate particles from a surface of the component to be cleaned.

22. The method of claim 21, further comprising:
   before projecting the patterned beam, detecting contamination by measuring the substrate on a substrate table using a level sensor;
   if contamination is detected, removing the substrate from the substrate table and cleaning the substrate table;
   replacing the substrate on the substrate table and detecting contamination by measuring the substrate again; and
   if contamination is detected again, rejecting the substrate.

23. A device manufactured by the method of claim 21 or claim 22.

* * * * *